United States Patent [19]
Ho

[11] Patent Number: 6,136,694
[45] Date of Patent: Oct. 24, 2000

[54] METHOD FOR FORMING VIA HOLE

[75] Inventor: Yueh-Feng Ho, Hsinchu Hsien, Taiwan

[73] Assignee: United Semiconductor Corp, Hsinchu, Taiwan

[21] Appl. No.: 09/223,330

[22] Filed: Dec. 30, 1998

[30] Foreign Application Priority Data

Nov. 6, 1998 [TW] Taiwan ................................. 87118499

[51] Int. Cl.$^7$ .............................................. H01L 21/4763
[52] U.S. Cl. ............................................ 438/637; 438/637
[58] Field of Search .................................... 438/637, 638, 438/639, 640, 745, 746; 430/323; 604/272

[56] References Cited

U.S. PATENT DOCUMENTS 5,374,503  12/1994  Sachdev ................................. 430/323
5,928,207  7/1999  Pisano et al. .......................... 604/272
5,970,376  10/1999  Chen ..................................... 438/637

Primary Examiner—David Nelms
Assistant Examiner—David Nhu
Attorney, Agent, or Firm—J.C. Patents; Jiawei Huang

[57] ABSTRACT

A method for forming a via hole provides a substrate, and a conducting layer is formed on the substrate. An intermetal dielectric layer is deposited conformal to the substrate, and a patterned photoresist is formed on the intermetal dielectric layer. The photoresist is used as a mask, and a portion of intermetal dielectric layer, which is not covered by the photoresist, is removed to expose the conducting layer, so that an opening is formed. A polymer layer is unavoidably formed on the surface of the opening, and then the photoresist and the polymer layer are removed. The residual polymer layer is removed by wet bench to form a via hole.

13 Claims, 4 Drawing Sheets

METHOD FOR FORMING VIA HOLE

CROSS-REFERENCE TO RELATED APPLICATION

This application claims the priority benefit of Taiwan application serial no. 87118499, filed Nov. 6, 1998, the full disclosure of which is incorporated herein by reference.

BACKGROUND OF THE INVENTION

1. Field of the Invention

The present invention relates to a method of manufacturing a semiconductor device. More particularly, the present invention relates to a method for forming a via hole.

2. Description of the Related Art

As the integration density of semiconductor devices increases, more circuit elements must to be packed in a unit surface area of the device substrate, and circuit elements such as interconnects are necessarily increased between MOS transistors of the IC device, especially semiconductor products such as microprocessor. In many highly integrated semiconductor devices, more than two levels of interconnecting metal layers are demanded, called multilevel interconnects. Between these multiple metal layers, electrically insulating material known as inter-metal dielectrics are used to provide isolation between the metal layers. Vias are formed in these inter-metal dielectric layers that can be filled with electrically conductive material to form plugs that provide electrical connection between the interconnects for different metal layers.

FIGS. 1A through 1D are schematic, cross-sectional views showing the progression of conventional manufacturing steps for a via hole. Referring to FIG. 1A, a substrate 100 having a MOS device is provided, and a metallic layer 102 is formed on the substrate 100. An intermetal dielectric layer 104 (IMD) is deposited conformal to the substrate 100, and a patterned photoresist 106 is formed on the intermetal dielectric layer 104.

As shown in FIG. 1B, the photoresist 106 is used as a mask, then the intermetal dielectric layer 104, which is not covered by the photoresist 106 is removed to expose the metallic layer 102, so that an opening 110 is formed. A polymer layer 108 is unavoidably formed on the surface of the opening 110.

As shown in FIG. 1C, the photoresist 106 is removed.

Referring to FIG. 1D, the polymer layer 108 on the surface of the opening 110 is removed by a solvent including ammonia (NH$_4$OH), and a residual polymer layer 109 on the surface of the opening 110 is removed by de-ionized water.

In order to remove the polymer layer 108 on the surface of the opening 110, the solvent including ammonia used, but the ammonia easily reacts with the intermetal dielectric layer 104 along the sidewalls of the opening 110 and the metallic layer 102 at the bottom of the opening 110 to result in a hydroxyl (—OH) group having polarity generated on the surface of the opening 110. Because the hydroxyl group having polarity causes a vapor absorption phenomenon, water evaporates to form air bubbles in the metal via while metal is filled into the metal via hole at a high temperature. A poisoned metal via hole is therefore induced by the vapor absorption phenomenon, which causes poor contact between metals and reduces the device yield. If de-ionized water is used to remove the polymers on the surface of the opening 110, the de-ionized water cannot absolutely eliminate the polymers on the metal via hole further to result in reduced device yield. In addition, a low-conductivity material is generally selected for intermetal dielectric layer 104 to ensure good insulation. Due to the inclusion of ammonia in the solvent used for removing the polymer layer 108 on the surface of the opening 110, a poisoned metal via hole easily occurs in an unlanded metal via process, which uses low conductivity material as an intermetal dielectric layer.

SUMMARY OF THE INVENTION

Accordingly, the purpose of the present invention is to provide a method for forming a via hole. The method can avoid occurrence of the poisoned metal via hole and eliminate the polymers on the surface of the metal via hole.

To achieve these and other advantages and in accordance with the purpose of the invention, as embodied and broadly described herein, the invention provides a method for forming a via hole. A substrate is provided, and a conducting layer is formed on the substrate. An intermetal dielectric layer is deposited conformal to the substrate, and a patterned photoresist is formed on the intermetal dielectric layer. The photoresist is used as a mask, then a portion of the intermetal dielectric layer, which is not covered by the photoresist, is removed to expose the conducting layer so that an opening is formed. A polymer layer is unavoidably formed on the surface of the opening, and then the photoresist and the polymer layer are removed. The residual polymer layer is removed by wet bench to form a via hole.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
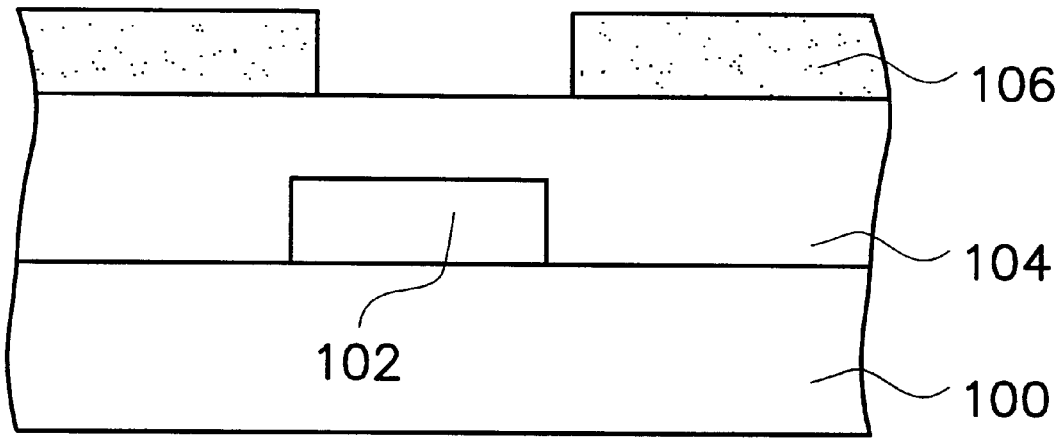
FIGS. 1A through 1D are schematic, cross-sectional views showing the progression of conventional manufacturing steps for a via hole.
Figure 1B:
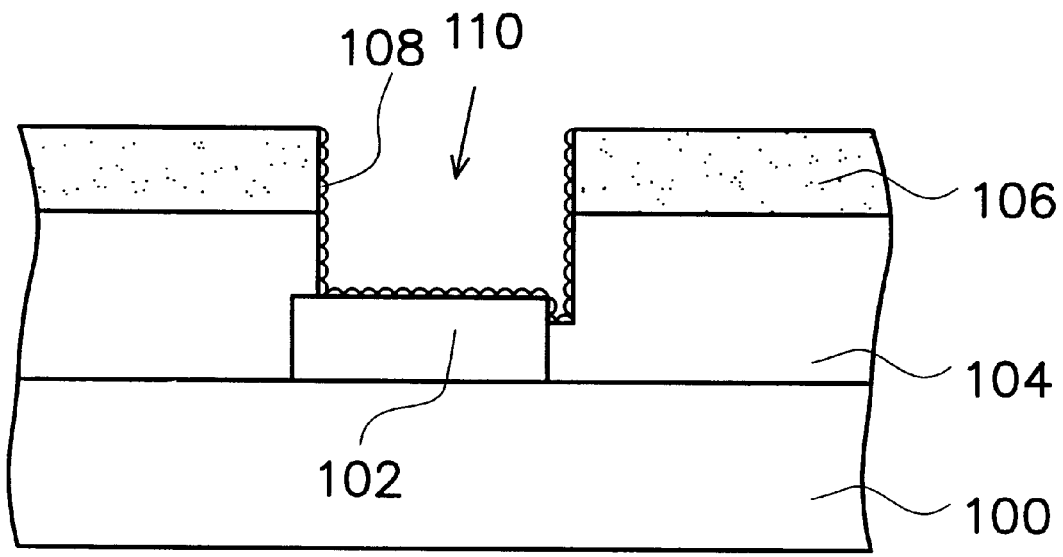
Figure 1C:
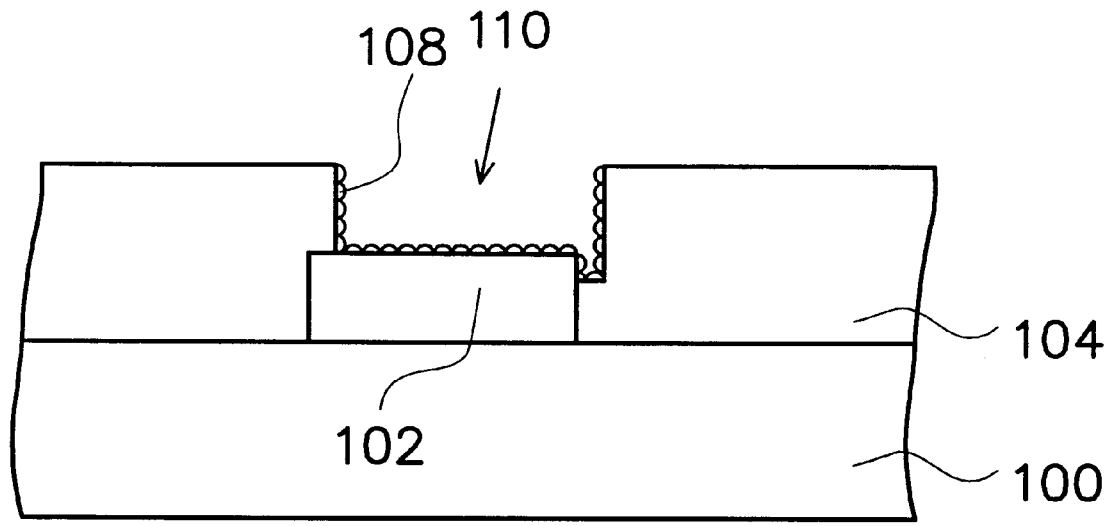
Figure 1D:
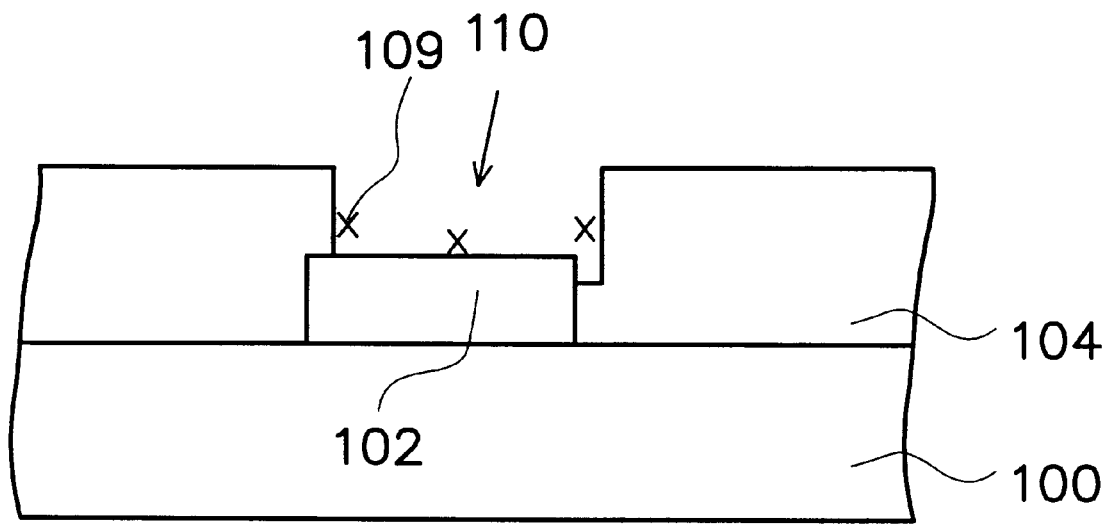

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing the progression of manufacturing steps for a via hole according to the preferred embodiment of this invention.

Figure 2A:
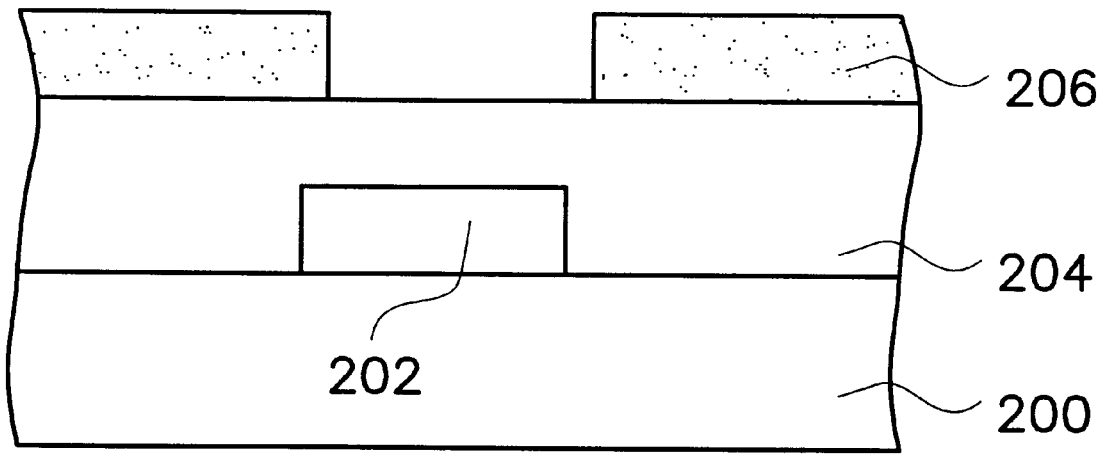
FIGS. 2A through 2D are schematic, cross-sectional views showing the progression of manufacturing steps for a via hole according to the preferred embodiment of this invention.

Referring to FIG. 2A, a substrate 200 having a MOS device is provided, and a conducting layer 202 such as a metallic layer is formed on the substrate 200. An intermetal dielectric layer 204 such as a silicon oxide layer is deposited conformal to the substrate 200, for example, by chemical vapor deposition (CVD), and a patterned photoresist 206 is formed on the intermetal dielectric layer 204.

Figure 2B:
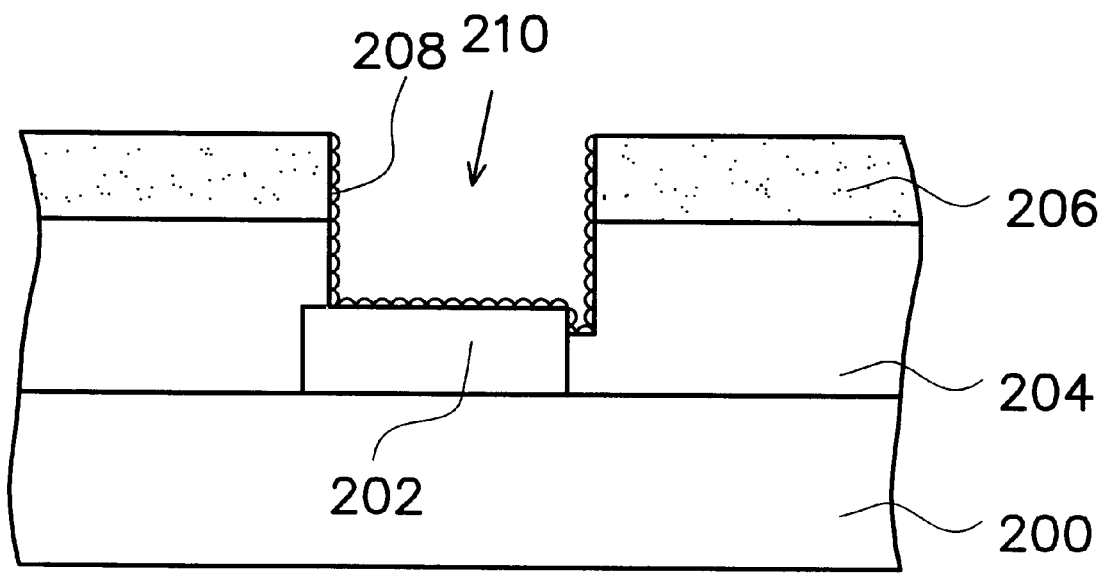

As shown in FIG. 2B, the photoresist 206 is used as a mask, and then a portion of the intermetal dielectric layer 204, which is not covered by the photoresist 206, is removed to expose the conducting layer 202, so that an opening 210 is formed, for example, by anisotropic etching including, for example, plasma etching. Because the plasma etching is controlled by two parallel mechanisms including an etching reaction and a polymer reaction, a polymer layer 208 is formed on the surface of the opening 210 as the opening 210 is formed by plasma etching.

Figure 2C:
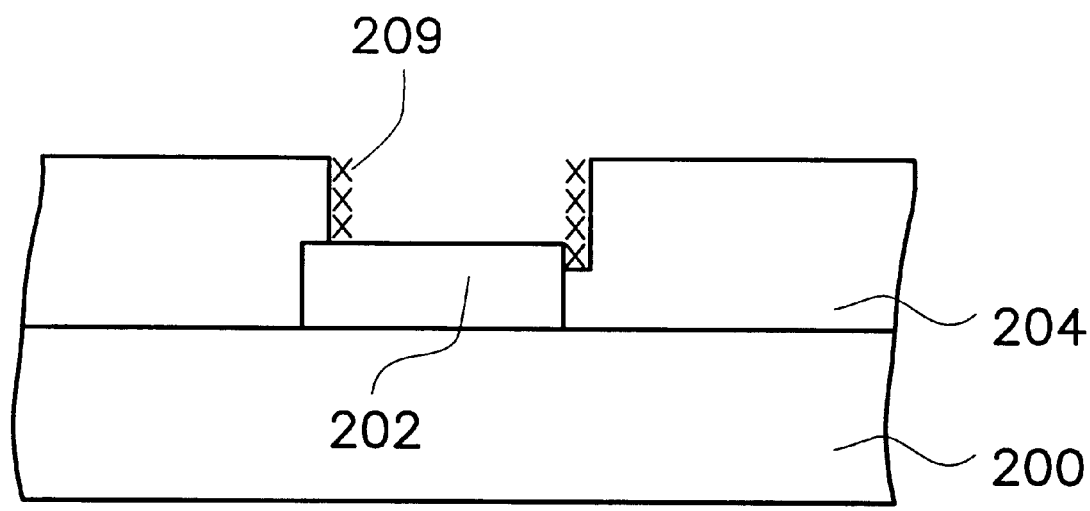

As shown in FIG. 2C, the photoresist 206 and the polymer layer 208 are removed, for example, by an in-situ method that allows the photoresist 206 and a portion of the polymer layer 208 to be removed simultaneously on the same machine, but a polymer layer 209 still remains on the surface of the opening 210.

Figure 2D:
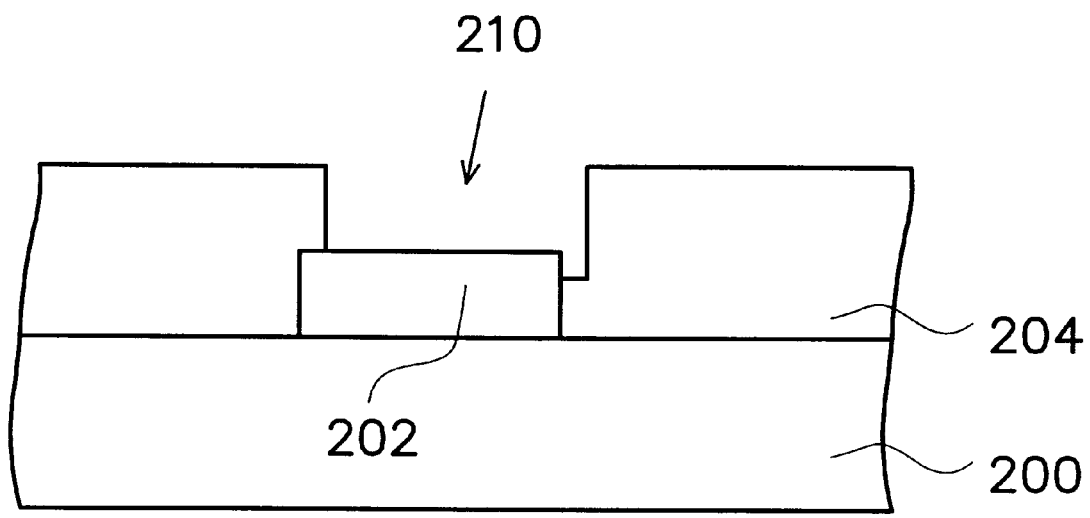

Referring to FIG. 2D, the residual polymer layer 209 is removed, for example, by wet bench to form a via hole 210. The wet bench includes (1) a post stripper rinse (PSR) step, which removes the residual polymer layer 209 on the surface of the opening 210 using a solvent including NMP component. Additionally, a megasonic step is used to accelerate removal of the polymers while the post stripper rinse step is performed. (2) A quick drain rinse step, which quickly flushes the wafer by water and (3) a final rinse step, which immerses the wafer in water. The resistance of the water is measured to estimate whether the residual polymer layer 209 is completely removed.

One characteristic of this invention is removal of the residual polymer layer 209 by wet bench. This method absolutely eliminates the polymer layer 209 on the surface of the opening 210 by a solvent in which no ammonia is used. The vapor absorption phenomenon cannot occur, and the poisoned metal via hole can be avoided, which further to preserves good contact between the plug and the conductive layers, and also enhances the device yield. Because a solvent with no ammonia is used for removing the polymer layer 209 on the surface of the opening 210, a poisoned metal via hole cannot occur in the unlanded metal via process, which uses low conductivity material as an intermetal dielectric layer.

(1) The invention for forming a via hole provides a solvent that does not include ammonia to remove the polymers on the metal via hole surface. The method can therefore avoid the poisoned metal via hole and improve the contact between the plug and the conductive layers.

(2) The invention for forming a via hole provides a solvent that contains no ammonia to absolutely eliminate the polymers on the metal via hole surface and enhance the device yield.

(3) The invention for forming a via hole not only applies to general metal via process, but also applies to unlanded metal via process, which uses low conductivity material as an intermetal dielectric layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a via hole, comprising the steps of:

providing a substrate having a conducting layer;

forming an intermetal dielectric layer conformal to the substrate;

forming a patterned photoresist as a mask on the intermetal dielectric layer, removing a portion of the intermetal dielectric layer to expose the conducting layer, so as to form an opening and a polymer layer on a surface of the opening;

removing the patterned photoresist and a portion of the polymer layer, so that a residual polymer layer remains on the surface of the opening; and cleaning the opening by a wet bench process, which process comprises a post stripper rinse step using a solvent containing N-methyl proidine (NMP), a quick drain rinse step using water, and a final rinse step using water.

2. The method of claim 1, wherein the conducting layer includes a metallic layer.

3. The method of claim 1, wherein the intermetal dielectric layer includes a silicon oxide layer.

4. The method of claim 1, wherein the post stripper rinse step further includes a megasonic step to accelerate removal of the polymers.

5. The method of claim 1, wherein the step of forming the intermetal dielectric layer includes using chemical vapor deposition.

6. The method of claim 1, wherein the step of removing a portion of the inter metal dielectric layer includes using anisotropic etching.

7. A method for forming a via hole, comprising the steps of:

providing a substrate having a conducting layer;

forming an intermetal dielectric layer conformal to the substrate;

patterning the intermetal dielectric layer to form an opening;

cleaning the opening by a wet bench process, which process further includes performing a post stripper rinse step using a solvent which includes N-methyl proidine (NMP), performing a quick drain rinse step using water, and performing a final rinse step using water.

8. The method of claim 7, wherein the conducting layer includes a metallic layer.

9. The method of claim 7, wherein the intermetal dielectric layer includes a silicon oxide layer.

10. The method of claim 7, wherein the post stripper rinse step further includes a megasonic step to accelerate removal of polymers.

11. The method of claim 7, wherein the step of forming the inter metal dielectric layer includes using chemical vapor deposition.

12. The method of claim 1, wherein the step of cleaning the opening by a wet bench process includes removing the residual polymer layer on the surface of the opening.

13. The method of claim 1, wherein the final rinse step further includes estimating an end point of the final rinse step by measuring a final rinse water resistivity.

* * * * *